United States Patent
Shimizu et al.

(10) Patent No.: US 9,147,646 B2
(45) Date of Patent: Sep. 29, 2015

(54) LEAD FRAME, METHOD FOR MANUFACTURING LEAD FRAME AND SEMICONDUCTOR DEVICE USING SAME

(75) Inventors: Koji Shimizu, Fukuoka (JP); Masanori Mitsui, Fukuoka (JP)

(73) Assignee: MITSUI HIGH-TEC, INC., Fukuoka (JP)

(*) Notice: Subject to any disclaimer, the term of this patent is extended or adjusted under 35 U.S.C. 154(b) by 57 days.

(21) Appl. No.: 14/236,168

(22) PCT Filed: Jul. 3, 2012

(86) PCT No.: PCT/JP2012/066958
§ 371 (c)(1),
(2), (4) Date: Jan. 30, 2014

(87) PCT Pub. No.: WO2013/018485
PCT Pub. Date: Feb. 7, 2013

(65) Prior Publication Data
US 2014/0159221 A1    Jun. 12, 2014

(30) Foreign Application Priority Data
Aug. 1, 2011  (JP) ................................. 2011-168599

(51) Int. Cl.
*H01L 23/495* (2006.01)
*H01L 21/48* (2006.01)
*H01L 23/31* (2006.01)
*H01L 23/00* (2006.01)

(52) U.S. Cl.
CPC ........ *H01L 23/4951* (2013.01); *H01L 21/4842* (2013.01); *H01L 23/3107* (2013.01); *H01L 23/49503* (2013.01); *H01L 23/49548* (2013.01); *H01L 24/03* (2013.01); *H01L 2224/48247* (2013.01)

(58) Field of Classification Search
CPC ............ H01L 23/495; H01L 23/49503; H01L 23/4951; H01L 23/49548; H01L 21/4842
See application file for complete search history.

(56) References Cited

U.S. PATENT DOCUMENTS

| | | | | |
|---|---|---|---|---|
| 5,167,794 | A * | 12/1992 | Ito | 205/149 |
| 5,227,421 | A | 7/1993 | Kageyama et al. | |
| 5,294,828 | A * | 3/1994 | Okumura | 257/676 |
| 5,558,267 | A * | 9/1996 | Humphrey et al. | 228/4.5 |
| 5,767,480 | A * | 6/1998 | Anglin et al. | 219/121.69 |
| 8,053,875 | B2 * | 11/2011 | Danno et al. | 257/666 |

(Continued)

FOREIGN PATENT DOCUMENTS

| | | | |
|---|---|---|---|
| JP | 03405030 B2 * | 6/1991 | |
| JP | 4-10346 | 1/1992 | |

(Continued)

OTHER PUBLICATIONS

International Search Report, mail date is Jul. 31, 2012.

*Primary Examiner* — Michele Fan
(74) *Attorney, Agent, or Firm* — Greenblum & Bernstein, P.L.C.

(57) ABSTRACT

Provided is a lead frame by which a die pad can be easily exposed when the lead frame is used for a semiconductor device. The lead frame has a die pad with an upper surface on which a semiconductor element is mounted. The lead frame is used for the semiconductor device with the exposed surface of the die pad being exposed from a sealing resin. A downwardly-projecting first metal burr is formed along the peripheral portion of the exposed surface of the die pad and heads of the first metal burr are flat.

8 Claims, 6 Drawing Sheets

(56) References Cited

U.S. PATENT DOCUMENTS

| | | | |
|---|---|---|---|
| 2001/0045625 A1* | 11/2001 | Sakamoto et al. | 257/666 |
| 2002/0005576 A1* | 1/2002 | Sakamoto et al. | 257/687 |
| 2003/0071344 A1* | 4/2003 | Matsuzawa et al. | 257/692 |
| 2003/0141577 A1* | 7/2003 | Hung et al. | 257/676 |
| 2003/0193080 A1* | 10/2003 | Cabahug et al. | 257/666 |
| 2007/0015338 A1* | 1/2007 | Lee et al. | 438/400 |
| 2007/0181983 A1* | 8/2007 | Takai et al. | 257/666 |
| 2010/0244214 A1* | 9/2010 | Arita et al. | 257/676 |
| 2013/0319744 A1* | 12/2013 | Wu et al. | 174/261 |
| 2014/0353814 A1* | 12/2014 | Sakamoto et al. | 257/712 |

FOREIGN PATENT DOCUMENTS

| | | | |
|---|---|---|---|
| JP | 06097340 A | * | 4/1994 |
| JP | 7-94635 | | 4/1995 |
| JP | 09027579 A | * | 1/1997 |
| JP | 2006-135100 | | 5/2006 |
| JP | 2008-270661 | | 11/2008 |
| JP | 2011-091145 | | 5/2011 |

* cited by examiner

LEAD FRAME, METHOD FOR MANUFACTURING LEAD FRAME AND SEMICONDUCTOR DEVICE USING SAME

TECHNICAL FIELD

The present invention relates to a lead frame of which a lower surface of a die pad is exposed, a method for manufacturing the lead frame and a semiconductor device using the same.

BACKGROUND ART

A semiconductor element is used for information or signal processing and also for current or power control of an electric circuit, an electronic circuit and the like. Since the semiconductor element that is used for the current or power control consumes higher current or voltage (power), compared to the semiconductor element that is used for the information or signal processing, it is referred to as a power element, in distinction from the usual semiconductor element.

Since a semiconductor device (which is also referred to as a semiconductor package) having the power element has high current flowing therein and operates under high voltage, a large amount of heat is generated. Hence, in order to discharge the heat generated from a chip (semiconductor element) in the semiconductor device to an outside, a heat spreader is inserted or a heat slug is attached to an exposed surface of a die pad. However, in recent years, in order to reduce the manufacturing cost of the semiconductor device, a scheme has been suggested in which the heat is directly radiated from a heat radiation surface formed by exposing the lower surface of the die pad to the outside of the semiconductor device.

When manufacturing the semiconductor device, the lower surface of the die pad is pressed to a resin molding die, a sealing resin is injected and the lower surface of the die pad is exposed to the outside from the package to thereby form an exposed surface. At this time, however, the sealing resin may flow through a gap between the lower surface of the die pad and the resin molding die. For this reason, the sealing resin is unintentionally injected to a boundary between the exposed surface of the die pad and a part to be covered by the sealing resin, so that a resin burr is formed. The resin burr covers a part or entirety of the exposed surface of the die pad becoming a heat discharge passage, thereby deteriorating a heat radiation property.

Regarding this, Patent Literature 1 discloses that the exposed surface of the die pad is formed with a ring-shaped recess. Thereby, the sealing resin infiltrated between the exposed surface of the die pad and the resin molding die upon the injection of the sealing resin is enabled to flow into the recess and the sealing resin is prevented from overflowing the recess and flowing to the exposed surface of the die pad.

Also, Patent Literature 2 discloses that the exposed surface of the die pad is pressed by a punch and a projection wall is formed on the periphery of the exposed surface of the die pad. The projection wall prevents the sealing resin from flowing to the exposed surface of the die pad positioned at an inner side of the projection wall.

CITATION LIST

Patent Literature

Patent Literature 1: JP-A-2006-135100
Patent Literature 2: JP-A-2008-270661

SUMMARY OF INVENTION

Technical Problem

According to the technology disclosed in Patent Literature 1, it is possible to suppress the formation of the resin burr by the recess and to secure an exposed area of the exposed surface of the die pad. However, the sealing resin flows into the recess, so that a thick resin burr is formed in the recess.

According to Patent Literature 2, the projection wall is formed on the periphery of the exposed surface of the die pad, so that the infiltration of the sealing resin is prevented. However, usually, in a manufacturing process of the semiconductor device of which the exposed surface of the die pad is exposed, upon the resin sealing, since a space for filling the sealing resin is formed between the die pad and the resin molding die, it is not possible to directly press the die pad with an upper die of the resin molding die. For this reason, when a height of the projection wall is slightly non-uniform, the resin is infiltrated through a gap of the projection wall, so that a thick resin burr is formed inside the projection wall of the exposed surface of the die pad.

Figure 9:
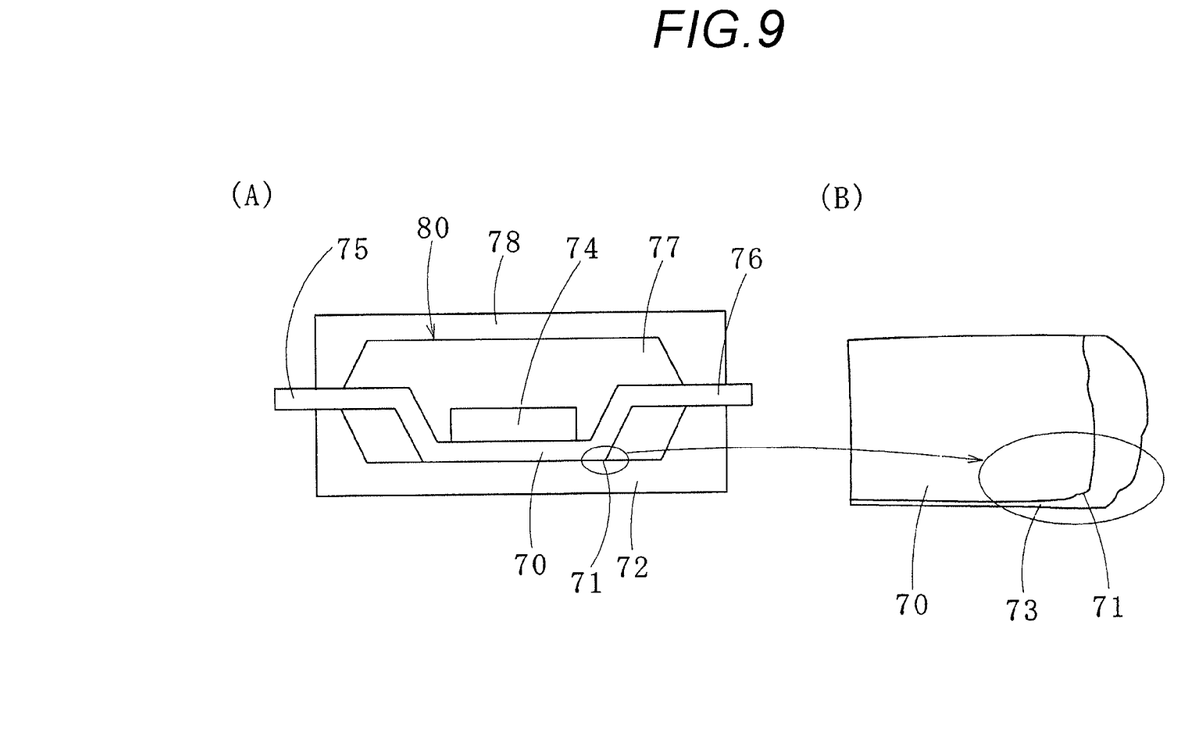
In FIG. 9, (A) is a cross-sectional view of a semiconductor device in a related art and (B) is a partially enlarged cross-sectional view of the semiconductor device.

Also, in any of Patent Literatures 1 and 2, as shown by (A) in FIG. 9, when a corner 71 of an exposed surface of a die pad 70 is not sharp, a sealing resin 77 is infiltrated through a lower die 72 of the resin molding die and the corner 71 of the exposed surface of the die pad 70, as shown by (B) in FIG. 9.

Figure 10:
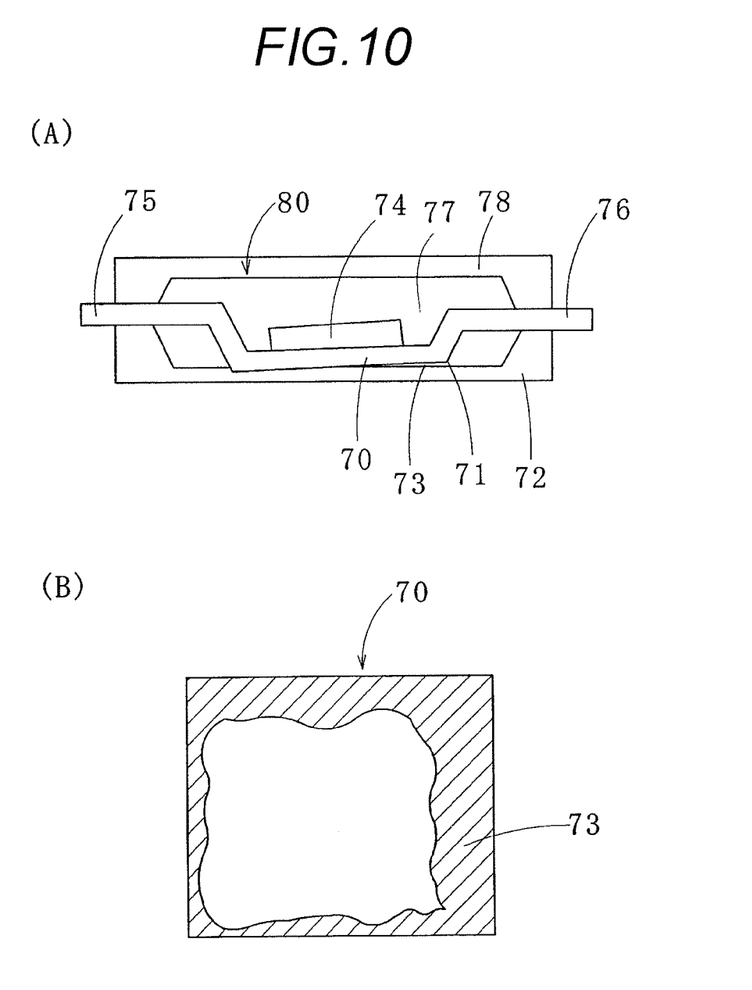
In FIG. 10, (A) is a cross-sectional view of a semiconductor device in a related art and (B) is a bottom view of a die pad of the semiconductor device.

Thereby, as shown by (A) in FIG. 10 and (B) in FIG. 10, the die pad 70 is partially pushed up by the infiltrated sealing resin 77 and the sealing resin 77 is cured with the die pad 70 being inclined. In this case, a thick resin burr 73 is formed at a part of the exposed surface of the die pad 70. Meanwhile, in FIGS. 9 and 10, a reference numeral 74 indicates a semiconductor element, reference numerals 75, 76 indicate leads and a reference numeral 78 indicates an upper die.

As described above, even with the technologies of Patent Literatures 1 and 2, the resin burr 73 is formed. When the resin burr 73 is formed, the heat radiation property of the semiconductor device may be deteriorated. Hence, when the resin burr 73 is formed, a semiconductor device 80 is dipped in a solution, which enables the resin burr 73 to be easily peeled off, for predetermined time and then a water stream of a high hydraulic pressure is bumped to the resin burr 73 to thereby remove the resin burr 73.

Also, in a method of removing the large and thick resin burr 73, after the resin molding, the resin burr 73 is irradiate with a laser to thus carbonize the resin burr 73, the semiconductor device 80 is dipped in the solution, which enables the resin burr 73 to be easily peeled off, for predetermined time and then the resin burr 73 is removed by a water stream of a high hydraulic pressure. This process is performed as pre-processing of an outer plating process.

When the resin burr 73 is thick or an area of the resin burr 73 is wide, however, the laser irradiation or dipping into the solution requires the long time, so that the manufacturing cost is increased. Also, not only the resin burr 73 but also the sealing resin 77 sealing a lead frame 81 is also peeled off by the process, so that a function of the semiconductor device 80 as a product may be damaged.

The present invention has been made keeping in mind the above situations, and an object of the present invention is to provide a semiconductor device in which a die pad can be easily exposed and which has a high heat radiation property, a lead frame that is used for the semiconductor device and a method of manufacturing the lead frame.

Solution to Problem

A lead frame according to the present invention that conforms with the object is a lead frame that includes a die pad having an upper surface on which a semiconductor element is mounted and that is used for a semiconductor device with a lower surface of the die pad being exposed from a sealing resin, wherein a downwardly-projecting first metal burr is formed along a peripheral portion of the lower surface of the die pad, and heads of the first metal burr are flat.

The lead frame according to the present invention may be configured so that a plurality of external terminals is provided on a periphery of the die pad, lower surfaces of the external terminals are flush with the lower surface of the die pad, a downwardly-projecting second metal burr is formed along a peripheral portion of the lower surface of each of the external terminals, and heads of the second metal burr are flat.

The lead frame according to the present invention may be configured so that a height of the first metal burr is larger than 0 μm and equal to or smaller than 10 μm.

A method for manufacturing a lead frame according to the present invention that conforms with the object is a method for manufacturing a lead frame that includes a die pad having an upper surface on which a semiconductor element is mounted and that is used for a semiconductor device with a lower surface of the die pad being exposed from a sealing resin, the method including:

pressing heads of a downwardly-projecting first metal burr with a punch to thereby flatten the heads of the first metal burr, wherein the first metal burr is formed along a peripheral portion of the lower surface of the die pad when the die pad is punched from a metal plate.

The method for manufacturing the lead frame according to the present invention may be configured by further including pressing heads of a downwardly-projecting second metal burr with a punch to thereby flatten the heads of the second metal burr, wherein the second metal burr is formed along a peripheral portion of a lower surface of each of a plurality of external terminals when the metal plate is punched so that the plurality of external terminals each of which having a lower surface flush with the lower surface of the die pad is formed on a periphery of the die pad.

The method for manufacturing the lead frame according to the present invention may be configured so that the first metal burr is formed to have a height being larger than 0 μm and equal to or smaller than 10 μm.

A semiconductor device according to the present invention that conforms with the object includes:

a semiconductor element;

a lead frame comprising a die pad having an upper surface on which the semiconductor element is mounted; and a sealing resin that seals the semiconductor element and the lead frame therein, wherein a lower surface of the die pad is exposed to an outside from the sealing resin, a downwardly-projecting first metal burr is formed along a peripheral portion of the lower surface of the die pad, and heads of the first metal burr are flat.

The semiconductor device according to the present invention may be configured so that the lead frame comprises a plurality of external terminals that is provided on a periphery of the die pad, lower surfaces of the external terminals are flush with the lower surface of the die pad, a downwardly-projecting second metal burr is formed along a peripheral portion of the lower surface of each of the external terminals, and heads of the second metal burr are flat.

Advantageous Effects of Invention

According to the lead frame and the semiconductor device of the present invention, since the first metal burr is formed along the peripheral portion of the exposed surface of the die pad, it is possible to suppress the sealing resin from being infiltrated to the exposed surface of the die pad by the first metal burr when sealing the lead frame and the semiconductor element by the sealing resin. Also, since the heads of the first metal burr are flattened, a contact area of the first metal burr with a lower die in the resin sealing process is increased, so that it is possible to suppress the sealing resin from being infiltrated to the exposed surface of the die pad. Therefore, the resin burr is difficult to form, and the resin form to be formed is small and thin, so that it can be easily removed. Hence, it is possible to provide the semiconductor device of which the exposed surface of the die pad can be easily exposed and which has a high heat radiation property and the lead frame that is used for the semiconductor device.

In addition, according to the manufacturing method of the lead frame of the present invention, the heads of the first metal burr, which are formed when the lead frame is punched from the metal plate, are flattened. Thereby, the formation of the resin burr is suppressed upon the manufacturing of the semiconductor device. Therefore, it is possible to manufacture the lead frame of which the exposed surface can be easily exposed when it is used for the semiconductor device by the simple process.

20

DESCRIPTION OF EMBODIMENTS

Hereinafter, embodiments of the present invention will be described with reference to the accompanying drawings.

Figure 1:
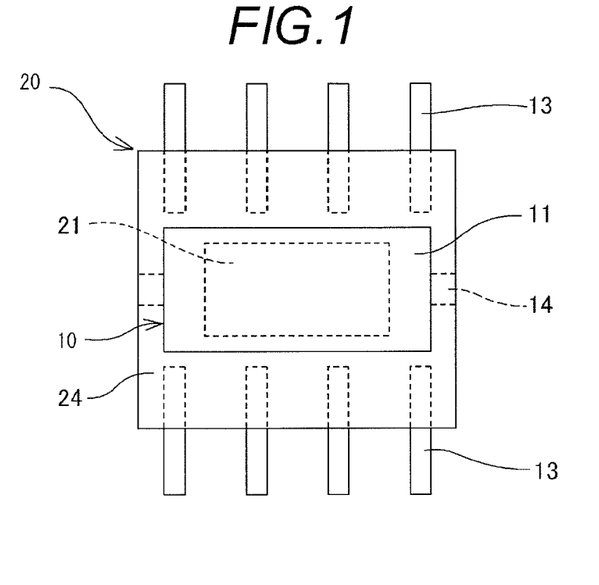
FIG. 1 is a bottom view of a semiconductor device according to an embodiment of the present invention.

FIG. 1 is a bottom view of a semiconductor device 20 according to an embodiment of the present invention. The semiconductor device 20 includes a semiconductor element 21, a lead frame 10 to which the semiconductor element 21 is mounted and a sealing resin 24 that integrally seals the semiconductor element 21 and the lead frame 10. Leads 13 and the semiconductor element 21 are electrically connected by bonding wires (not shown).

Figure 2:
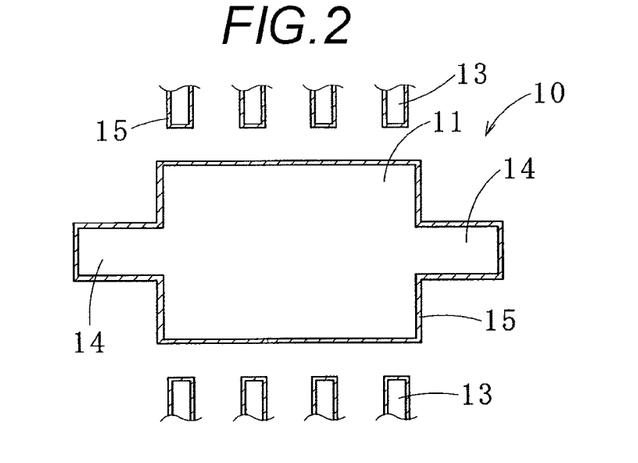
FIG. 2 is a partial backside view of a lead frame.

FIG. 2 is a backside view of the lead frame 10. The lead frame 10 includes a die pad 11 to which the semiconductor element 21 is mounted, support leads 14 that extend laterally from the die pad 11 and leads 13 that extend outwardly from the die pad 11. In the meantime, the die pad 11 (and the support leads 14) and the leads 13 are connected to one metal plate by a connection part (not shown). Also, the one metal plate may be formed with a plurality of die pads 11 and the like. Meanwhile, in FIG. 2, a hatched area indicates a region in which a metal burr 15, which will be described later, is formed.

Figure 3:
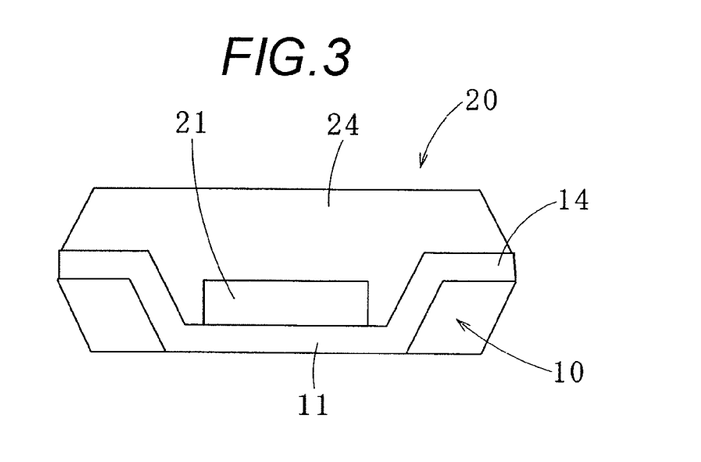
FIG. 3 is a cross-sectional side view of the semiconductor device shown in FIG. 1.

FIG. 3 is a cross-sectional view of the semiconductor device 20 shown in FIG. 1. An upper surface of the die pad 11 is a mounting surface and the semiconductor element 21 is mounted on the mounting surface. A lower surface of the die pad 11 is an exposed surface and is exposed to the outside from the sealing resin 24. Thereby, heat that is generated from the semiconductor element 21 is effectively escaped outwardly through the exposed surface.

Figure 4:
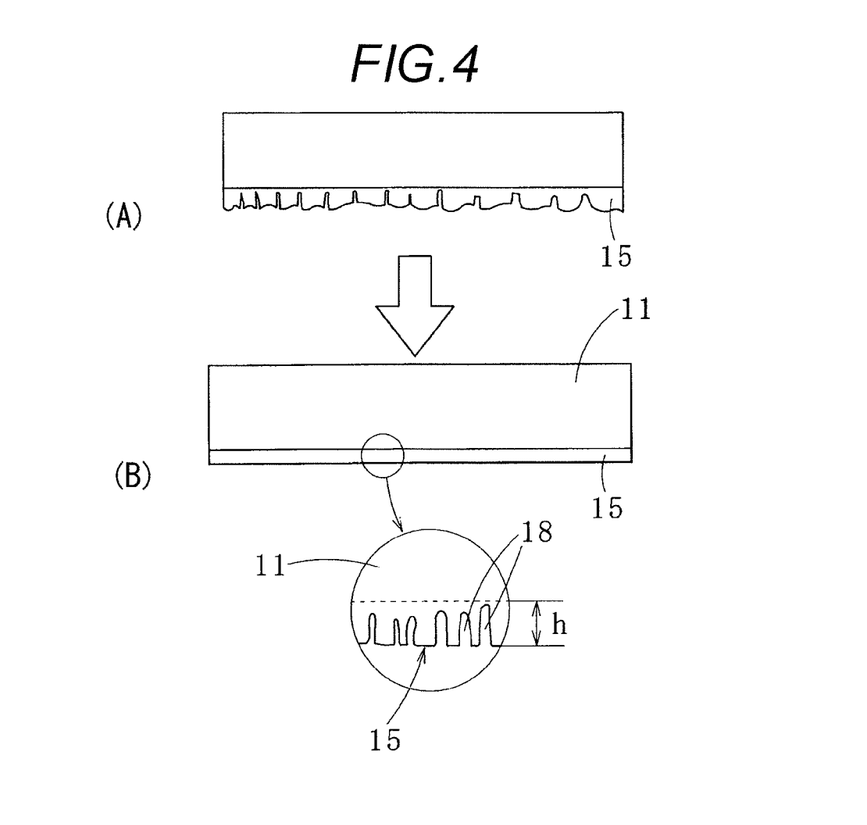
In FIG. 4, (A) and (B) show a manufacturing process of the lead frame.

Subsequently, a method for manufacturing the lead frame 10 that is used for the semiconductor device 20 is described. FIG. 4 shows a manufacturing process of the lead frame 10. In FIG. 4, (A) shows the lead frame 10 after punching processing is performed for a metal plate and (B) shows the lead frame 10 after pressing processing is performed by a flat punch.

The lead frame 10 is formed into a desired shape including the die pad 11, the support leads 14 and the leads 13 by punching a metal plate with a punch and a die. As the metal plate, a thin plate-shaped member made of copper or copper alloy may be used.

The punch and the die are arranged so that a clearance of about 1 to 10 μm is formed between them. For this reason, when punching the metal plate, a part entering the clearance is ductile-fractured, so that a metal burr (a first metal burr) 15 is formed, as shown in FIG. 2. When the die is fixed and the punch is moved from the upper towards the lower, the metal burr 15 that extends towards the lower of the lead frame 10 along the moving direction of the punch is formed, as shown in FIG. 4.

In this case, in order to punch the metal plate into a desired shape, the die and the punch are formed into a shape corresponding to the desired shape. For this reason, the clearance formed between them also has a shape corresponding to a contour of the desired shape. Hence, as shown in FIG. 2, the metal burr 15 is formed along a periphery of the lead frame 10, i.e., peripheries of respective exposed surfaces of the die pad 11, the leads 13 and the support leads 14.

Also, during the process, a height size (a size in the upper-lower direction) of the metal burr 15 is preferably formed to be 5 μm or larger and 25 μm or smaller. By adjusting the clearance between the punch and the die, it is possible to adjust the height size of the metal burr 15. In the meantime, heads of the metal burr 15 of this state have a convexo-concave shape.

Also, as shown by (B) in FIG. 4, the heads of the metal burr 15 are pressed by a flat punch of which a head has a flat surface. Thereby, the height h of the metal burr 15 is reduced and the heads of the metal burr 15 are pressed into a flat shape. Preferably, the pressing is performed so that the height h of the metal burr 15 after the pressing is larger than 0 μm and equal to or smaller than 10 μm, preferably 3 μm.

In the meantime, the metal burr 15 is preferably pressed by the flat punch having a head surface larger than the die pad 11 so that the heads of the entire metal burr 15 formed along the periphery of the die pad 11 can be pressed at a time by a singular flat surface. Thereby, it is possible to easily make the height h of the metal burr 15 uniform.

In the meantime, as described above, the part of the metal plate is ductile-fractured by the punch and the die, so that the metal burr 15 is formed. During this process, gaps 18 extending in the upper-lower direction may be formed. However, the gaps 18 are also closed or contracted during the pressing of the metal burr 15.

By the above process, the lead frame 10 having the die pad 11, the support leads 14 and the leads 13, which are connected to the metal plate by the connection part (not shown), is formed.

The semiconductor device 20 is formed using the lead frame 10, as mentioned below.

First, the leads 13 and the die pad 11 are cut off from the metal plate of the lead frame 10 and the lead frame 10 is deformed into the shape shown in FIG. 3 by performing the pressing processing for the die pad 11.

Then, the semiconductor element 21 is fixed on the die pad 11 of the lead frame 10 and the semiconductor element 21 and the respective leads 13 are connected by the bonding wires (not shown) to thus obtain an interim product. After that, the interim product is put and is resin-sealed between a lower die and an upper die for resin sealing, so that the semiconductor device 20 is completed.

According to the semiconductor device 20 of this embodiment, when performing the resin sealing to form the semiconductor device 20 by using the lead frame 10, the metal burr 15 provided on the periphery of the die pad 11 can prevent the sealing resin 24 from flowing towards a central part of the die pad 11.

Figure 5:
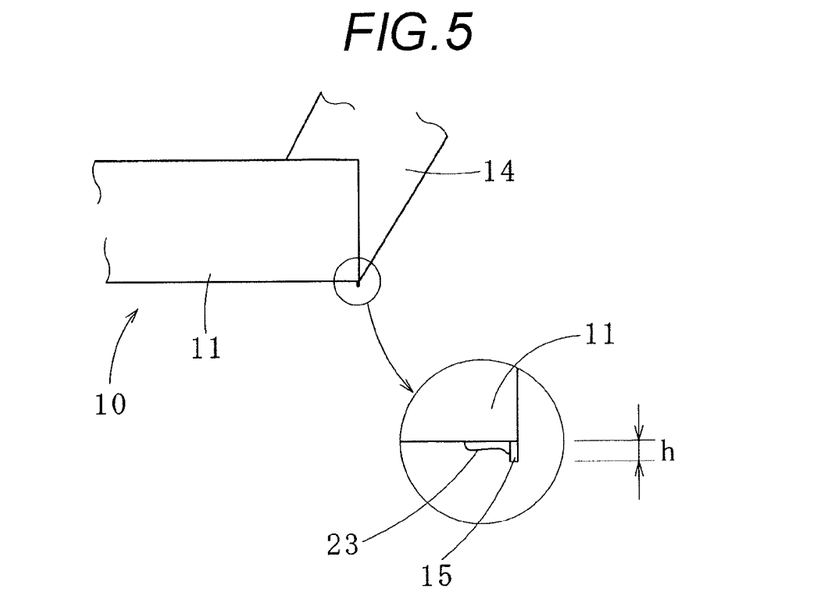
FIG. 5 is a partial side view of the lead frame.

FIG. 5 is an enlarged side sectional view of the exposed surface of the die pad 11 of the lead frame 10. As shown in the figure, in the semiconductor device 20 using the lead frame 10 of this embodiment, a thin resin burr 23 of a small area is formed into a mottle shape along a peripheral portion of the exposed surface of the die pad 11 and the exposed surface of the die pad 11 is non-uniformly exposed from a part of the resin burr 23. Also, the resin burr 23 is formed only in a narrow region relating to the metal burr 15.

When the resin burr 23 is thinner and smaller, the dipping time into a solution for removing the resin burr can be shortened, so that it is hard for the sealing resin 24 sealing the semiconductor element 21 to be badly influenced. Also, even when the resin burr 23 is removed by irradiating with a laser beam, the irradiation time can be shortened, so that it is possible to remove the resin burr 23 at low cost and in a short time. Also, the resin burr 23 is formed along the metal burr 15 formed on the periphery of the die pad 11. For this reason, even if the resin burr 23 is not removed, the heat radiation property of the semiconductor element 21 is little badly influenced.

Also, when punching the lead frame 10, the metal plate is punched from the upper towards the lower by the punch, so that the metal burr 15 is formed to extend downwardly. That is, the metal burr 15 extends towards the exposed surface-side of the die pad 11. At this time, the entire lead frame 10 is bent so that the peripheral portion thereof more projects downwardly than the central part.

For this reason, when the lead frame 10 is arranged in the die for resin sealing, the peripheral portion of the die pad 11 is more strongly pressed to the surface of the lower die for resin sealing, compared to the central part. Hence, heads of the metal burr 15 are closely contacted to the surface of the lower die, so that it is possible to suppress the sealing resin 24 from being infiltrated to the exposed surface of the die pad 11.

On the other hand, in the related art, the metal burr is formed on an opposite side to the exposed surface of the die pad and the entire lead frame is bent so that the central part more projects downwardly than the peripheral portion. For this reason, as shown in FIG. 9 or 10, the sealing resin is infiltrated from the periphery or corner of the exposed surface of the die pad upon the resin sealing. Thereby, a large and thick resin burr is formed.

Also, according to the lead frame 10 of this embodiment, after the metal burr 15 is formed by punching processing, the heads of the metal burr 15 are flattened by the flat punch. Therefore, in the resin sealing process, a contact area of the heads of the metal burr 15 with the surface of the lower die is increased, so that the sealing resin 24 can be suppressed from being infiltrated to the exposed surface of the die pad 11.

Also, the heads of the metal burr 15 are pressed by the flat punch, so that the height h of the metal burr 15 is lowered. For this reason, when the lead frame 10 is arranged in the die for resin sealing, a height of a space that is formed between the exposed surface of the die pad 11 and the lower die is also decreased. Therefore, even when the sealing resin is infiltrated into the space, a thickness of the resin burr 23 to be formed is decreased. In this case, the height h of the metal burr 15 is preferably larger than 0 μm and equal to or smaller than 10 μm.

Also, according to the manufacturing method of the lead frame 10 of this embodiment, the heads of the metal burr 15, which are formed when punching the lead frame 10 from the metal plate, are flattened and the formation of the resin burr 23 is suppressed using the metal burr 15 upon the manufacturing of the semiconductor device 20. Therefore, the lead frame 10 of which the exposed surface can be easily exposed when it is used for the semiconductor device 20 can be provided at low cost by effectively using the metal burr that is inevitably formed upon the punch processing. Also, it is possible to manufacture the lead frame 10 by the simple process of squashing the head of the metal burr with the flat punch.

Also, when flattening the heads of the metal burr 15 by the flat punch, the height h of the metal burr 15 is preferably made to be uniform. Thereby, in the resin sealing process, when the lead frame 10 is arranged in the die for resin sealing, the lead frame 10 does not rattle and the head of the entire metal burr 15 is contacted to the surface of the lower die. For this reason, it is possible to effectively suppress the sealing resin 24 from being infiltrated to the exposed surface of the die pad 11.

Meanwhile, in the punching processing, since the metal burr 15 is formed into an irregular shape, the gaps 18 may be formed in the metal burr 15. Ideally, the gaps 18 in the metal burr 15 are preferably closed in the pressing processing using the flat punch. However, even though the gaps 18 are not fully closed, the metal burr 15 is deformed so that the gaps 18 become smaller in the pressing processing using the flat punch.

Figure 6:
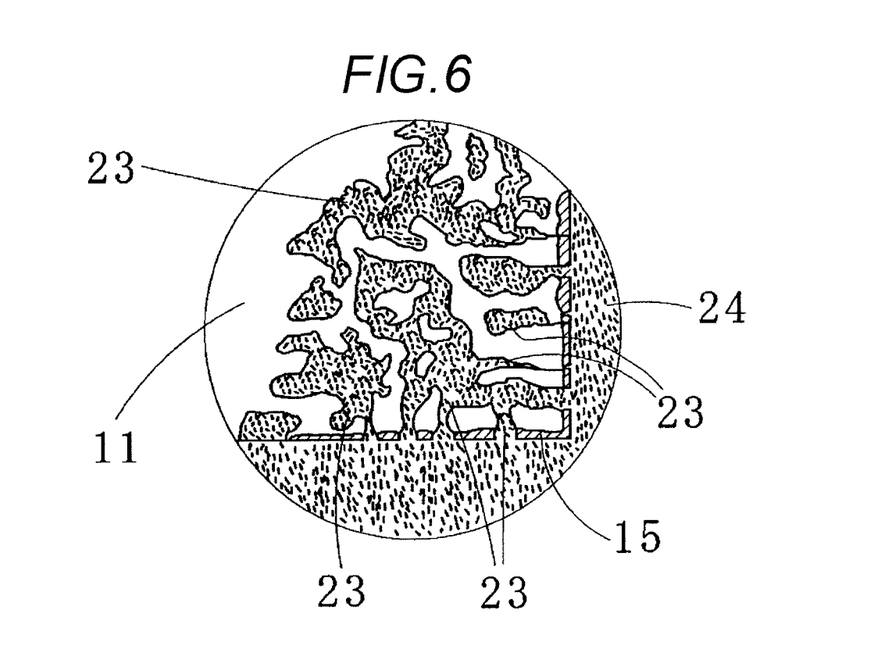
FIG. 6 is a partially enlarged view of an exposed surface of the lead frame.

FIG. 6 is an enlarged view showing the corner of the exposed surface of the die pad 11 of the semiconductor device 20. As shown in FIG. 6, since the gaps 18 of the metal burr 15 are small, an amount of the sealing resin 24 flowing from the gaps 18 to the exposed surface of the die pad 11 is small. For this reason, the resin burr 23 to be formed is thin and small. Therefore, the resin burr 23 can be easily removed, so that the semiconductor device 20 having a high heat radiation property can be provided.

Also, as disclosed in Patent Literatures 1 and 2, when the die pad is formed with a U recess or a V recess or the die pad is bent, a size of the semiconductor device to be mounted is limited. However, according to the lead frame 10 of this embodiment, since the die pad 11 is not subject to any processing, it is possible to utilize the die pad 11 to the utmost extent and to remove the restrictions on the design.

In the meantime, when mounting the semiconductor device 20 on a board, an outer plating of a thickness of 5 to 18 μm is performed on the exposed surface of the die pad 11 and the exposed surface of the die pad 11 is mounted on the substrate by a soldering of a height of 50 to 150 μm. For this reason, even when the height h of the metal burr 15 of the semiconductor device 20 is higher than 10 μm, it does not exert a bad influence on the heat radiation property of the semiconductor device 20 because the exposed surface of the die pad 11 is closely contacted to the board.

Although the present invention has been specifically with reference to the specific embodiment, it is apparent to one skilled in the art that a variety of changes and modifications can be made without departing from the spirit and scope of the present invention.

For example, in the above embodiment, the respective leads project from the sides of the semiconductor device. In addition, the present invention can be also applied to a semiconductor device in which terminals (external connection terminals) are exposed from a bottom of the semiconductor device.

Figure 7:
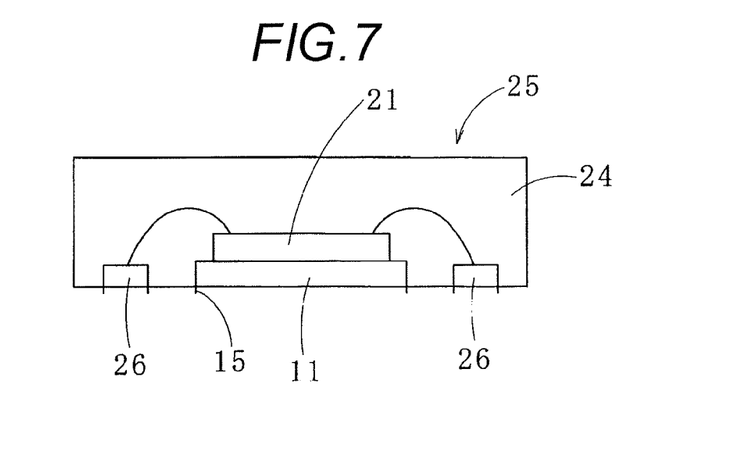
FIG. 7 is a cross-sectional side view of a semiconductor device according to a modified embodiment of the present invention.
Figure 8:
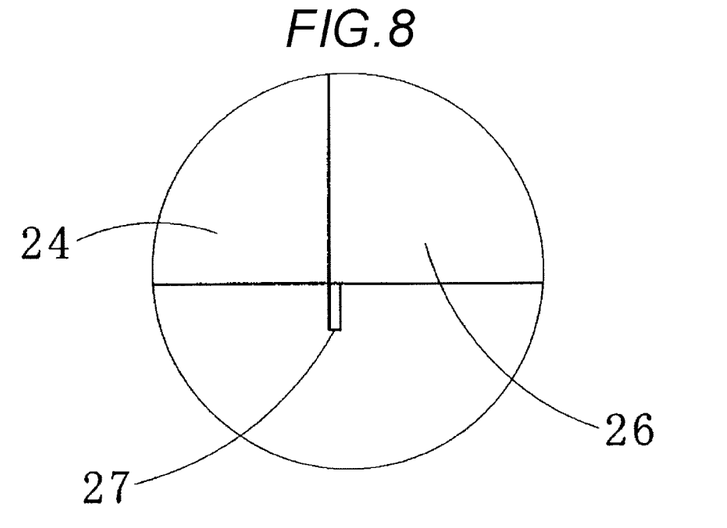
FIG. 8 is a partially enlarged view of the semiconductor device shown in FIG. 7.

FIG. 7 is a cross-sectional view of a semiconductor device 25 according to a modified embodiment of the present invention and FIG. 8 is an enlarged view showing a lower surface of an external terminal 26 of the semiconductor device 25. As shown in FIGS. 7 and 8, the semiconductor device 25 has a plurality of external terminals 26 on the periphery of the die pad 11. A lower surface of the external terminal 26 is flush with the exposed surface of the die pad 11.

As described above, in the semiconductor device 25, the exposed surface of the die pad 11 is formed with the metal burr 15. Also, like the metal burr 15, a metal burr (a second metal burr) 27 of which heads are pressed and flattened by the punch is formed along a periphery portion of the lower surface of the external terminal 26. Even in the semiconductor device 25, the resin burr formed on the lower surface of the external terminal 26 is easily peeled off upon the resin sealing.

A height of the metal burr 27 is preferably formed to be larger than 0 μm and equal to or smaller than 10 μm so that it is the same as the height h of the metal burr 15. Thereby, the sealing resin is hard to enter the exposes surface of the die pad 11 and the lower surface of the external terminal 26.

The present application is based on Japanese Patent Application No. 2011-168599 filed on Aug. 1, 2011, the contents of which are incorporated herein by reference.

Industrial Applicability

According to the lead frame and the semiconductor device of the present invention, since the first metal burr is formed along the peripheral portion of the exposed surface of the die pad, it is possible to suppress the sealing resin from being infiltrated to the exposed surface of the die pad by the first metal burr when sealing the lead frame and the semiconductor element by the sealing resin. Also, since the heads of the first metal burr are flattened, the contact area of the first metal burr with the lower die in the resin sealing process is increased, so that it is possible to suppress the sealing resin from being infiltrated to the exposed surface of the die pad. Therefore, the resin burr is hard to be formed, and the resin to be formed is small and thin, so that it can be easily removed. Hence, it is possible to provide the semiconductor device of which the exposed surface of the die pad can be easily exposed and which has a high heat radiation property and the lead frame that is used for the semiconductor device.

REFERENCE SIGNS LIST

10: lead frame
11: die pad
13: lead
14: support lead
15: metal burr
18: gap
20: semiconductor device
21: semiconductor element
23: resin burr
24: sealing resin
25: semiconductor device
26: external terminal
27: metal burr

The invention claimed is:

1. A lead frame that comprises a die pad having an upper surface on which a semiconductor element is mounted and that is used for a semiconductor device with a lower surface of the die pad being exposed from a sealing resin, wherein
a downwardly-projecting first metal burr is formed along a peripheral portion of the lower surface of the die pad, and
heads of the first metal burr are flat.

2. The lead frame according to claim 1, wherein
a plurality of external terminals is provided on a periphery of the die pad,
lower surfaces of the external terminals are flush with the lower surface of the die pad,
a downwardly-projecting second metal burr is formed along a peripheral portion of the lower surface of each of the external terminals, and
heads of the second metal burr are flat.

3. The lead frame according to claim 1, wherein
a height of the first metal burr is larger than 0 μm and equal to or smaller than 10 μm.

4. A method for manufacturing a lead frame that comprises a die pad having an upper surface on which a semiconductor element is mounted and that is used for a semiconductor device with a lower surface of the die pad being exposed from a sealing resin, the method comprising:
pressing heads of a downwardly-projecting first metal burr with a punch to thereby flatten the heads of the first metal burr, wherein the first metal burr is formed along a peripheral portion of the lower surface of the die pad when the die pad is punched from a metal plate.

5. The method for manufacturing the lead frame according to claim 4, further comprising
pressing heads of a downwardly-projecting second metal burr with a punch to thereby flatten the heads of the second metal burr, wherein the second metal burr is formed along a peripheral portion of a lower surface of each of a plurality of external terminals when the metal plate is punched so that the plurality of external terminals each of which having a lower surface flush with the lower surface of the die pad is formed on a periphery of the die pad.

6. The method for manufacturing the lead frame according to claim 4, wherein
the first metal burr is formed to have a height being larger than 0 μm and equal to or smaller than 10 μm.

7. A semiconductor device comprising:
a semiconductor element;
a lead frame comprising a die pad having an upper surface on which the semiconductor element is mounted; and
a sealing resin that seals the semiconductor element and the lead frame therein, wherein
a lower surface of the die pad is exposed to an outside from the sealing resin,
a downwardly-projecting first metal burr is formed along a peripheral portion of the lower surface of the die pad, and
heads of the first metal burr are flat.

8. The semiconductor device according to claim 7, wherein
the lead frame comprises a plurality of external terminals that is provided on a periphery of the die pad,
lower surfaces of the external terminals are flush with the lower surface of the die pad,
a downwardly-projecting second metal burr is formed along a peripheral portion of the lower surface of each of the external terminals, and
heads of the second metal burr are flat.

* * * * *